United States Patent
Shah et al.

(10) Patent No.: US 9,208,261 B2
(45) Date of Patent: Dec. 8, 2015

(54) POWER REDUCTION FOR FULLY ASSOCIATED TRANSLATION LOOKASIDE BUFFER (TLB) AND CONTENT ADDRESSABLE MEMORY (CAM)

(71) Applicant: Oracle International Corporation, Redwood City, CA (US)

(72) Inventors: Manish Shah, Austin, TX (US); Gideon Levinsky, Cedar Park, TX (US)

(73) Assignee: Oracle International Corporation, Redwood Shores, CA (US)

( * ) Notice: Subject to any disclaimer, the term of this patent is extended or adjusted under 35 U.S.C. 154(b) by 111 days.

(21) Appl. No.: 14/163,096

(22) Filed: Jan. 24, 2014

(65) Prior Publication Data

US 2015/0213153 A1 Jul. 30, 2015

(51) Int. Cl.
G06F 17/30 (2006.01)
G11C 15/00 (2006.01)
G06F 12/10 (2006.01)

(52) U.S. Cl.
CPC ...... G06F 17/30982 (2013.01); G06F 12/1054 (2013.01); G11C 15/00 (2013.01); G06F 2212/301 (2013.01); G06F 2212/684 (2013.01)

(58) Field of Classification Search
CPC .......................... G06F 17/30982; G11C 15/00
USPC ................. 711/207, 169, 205; 710/1, 300, 52
See application file for complete search history.

(56) References Cited

U.S. PATENT DOCUMENTS

| | | | |
|---|---|---|---|
| 6,535,959 B1 | 3/2003 | Ramprasad et al. | |
| 7,043,600 B2 * | 5/2006 | Chow et al. | 711/108 |
| 7,117,290 B2 * | 10/2006 | Shen et al. | 711/3 |
| 7,177,981 B2 | 2/2007 | Davis | |
| 8,156,309 B2 * | 4/2012 | Steiss | 711/207 |
| 8,335,122 B2 | 12/2012 | Dreslinski et al. | |

* cited by examiner

*Primary Examiner* — Tammara Peyton
(74) *Attorney, Agent, or Firm* — Meyertons Hood Kivlin Kowert & Goetzel; Erik A. Heter

(57) ABSTRACT

An apparatus and method for saving power during TLB searches is disclosed. In one embodiment, a TLB includes a CAM having a plurality of entries each storing a virtual address, and enable logic coupled to the CAM. Responsive to initiation of a TLB query by a thread executing on a processor that includes the TLB, the enable logic is configured to enable only those CAM entries that are associated with the initiating thread. Entries in the CAM not associated with the thread are not enabled. Accordingly, an initial search of the TLB for responsive to the query is conducted only in the CAM entries that are associated with the thread. Those CAM entries that are not associated with the thread are not searched. As a result, dynamic power consumption during TLB searches may be reduced.

15 Claims, 8 Drawing Sheets

POWER REDUCTION FOR FULLY ASSOCIATED TRANSLATION LOOKASIDE BUFFER (TLB) AND CONTENT ADDRESSABLE MEMORY (CAM)

BACKGROUND

1. Technical Field

This disclosure relates to processors, and more particularly, to a translation lookaside buffer (TLB) used to store address translations.

2. Description of the Related Art

Modern processors use a structure known as a translation lookaside buffer (TLB) to store virtual-to-physical address translations. When executing a thread, a processor may use virtual addresses to indicate a memory location for data and/or instructions that will be requested by that thread. Each virtual address corresponds to a physical address within the main memory of the system in which the processor is implemented. When a thread executing on a processor needs to access data or instructions stored in memory, it may query the TLB by providing a virtual address. The TLB may then be searched to determine if it currently storing an address translation corresponding to the virtual address. A TLB hit occurs when it is affirmatively determined that the TLB is storing the corresponding translation, based on a match between the provided virtual address and a virtual address stored in the TLB. If the TLB is not storing the requested translation (a TLB miss), then a data structure known as page table may be accessed to determine the address translation.

A TLB typically includes a content addressable memory (CAM) and a random access memory (RAM). Each CAM entry corresponds to one of the RAM entries. Each CAM entry may store a virtual address (and may store other information as well, such as a process ID, etc.). Each RAM entry may store a physical address. When a TLB search is conducted, each CAM entry may be compared to information provided as part of a TLB query. If the comparison determines that the requested virtual address is stored in the CAM, the corresponding entry in the RAM may be read to provide the physical address associated with the virtual address.

SUMMARY OF THE DISCLOSURE

An apparatus and method for saving power during TLB searches is disclosed. In one embodiment, a TLB includes a CAM having a plurality of entries each storing a virtual address, and enable logic coupled to the CAM. Responsive to initiation of a TLB query by a thread executing on a processor that includes the TLB, the enable logic is configured to enable only those CAM entries that are associated with the initiating thread. Entries in the CAM not associated with the thread are not enabled. Accordingly, an initial search of the TLB for responsive to the query is conducted only in the CAM entries that are associated with the thread. Those CAM entries that are not associated to with the thread are not searched. As a result, dynamic power consumption during TLB searches may be reduced.

In one embodiment, a method includes providing a query to a translation lookaside buffer (TLB), wherein the query is associated with a particular one of a plurality of threads executing on a processor. The method further includes searching content addressable memory (CAM) entries in a CAM of the TLB based on which of the CAM entries are associated with the particular one of the plurality of threads. The method further includes inhibiting searching of CAM entries that are not associated with the particular one of the plurality of threads providing a query to a translation lookaside buffer (TLB), wherein the query is associated with a particular one of a plurality of threads executing on a processor.

BRIEF DESCRIPTION OF THE DRAWINGS

Other aspects of the disclosure will become apparent upon reading the following detailed description and upon reference to the accompanying drawings which are now briefly described.

Figure 1:
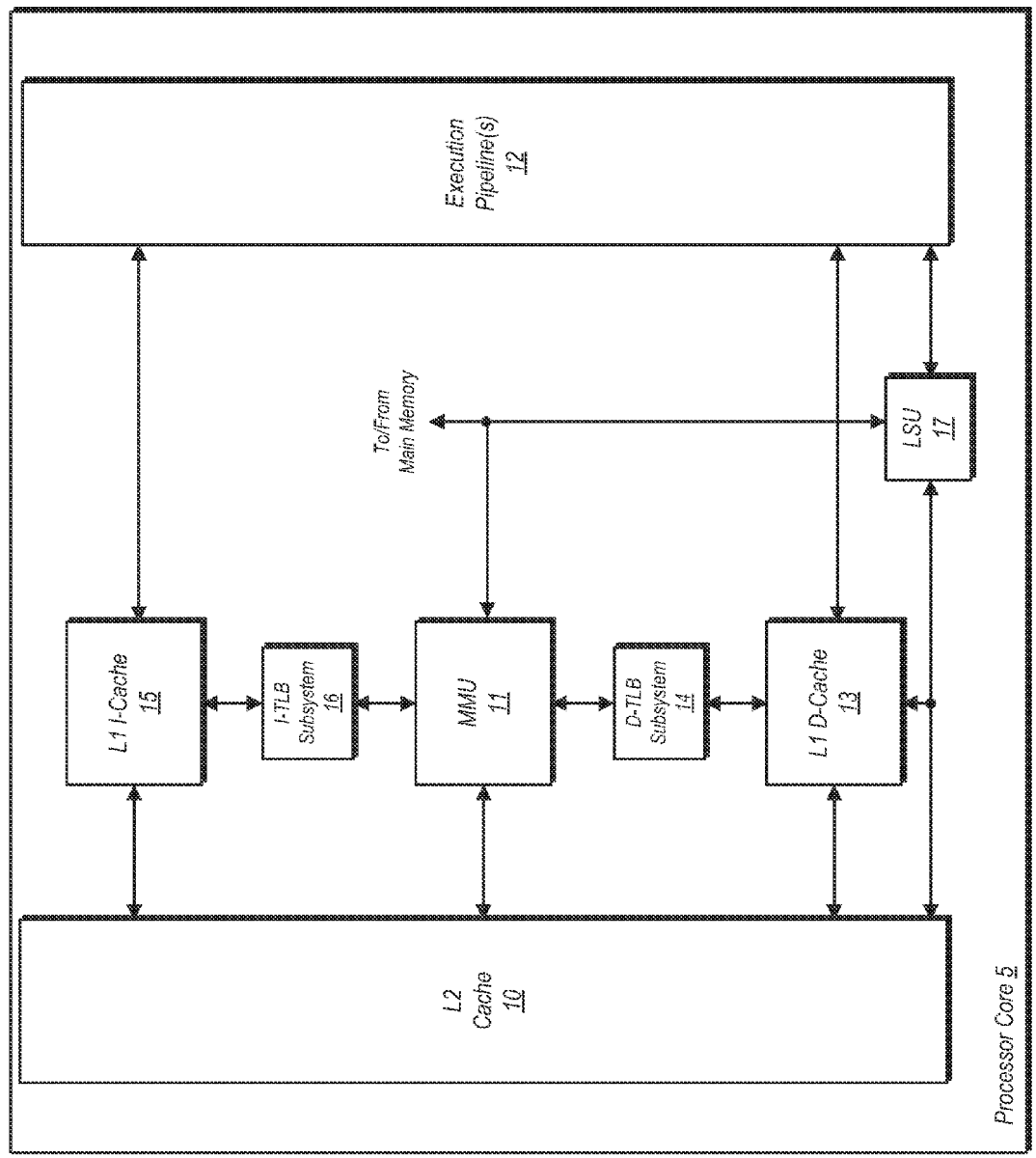
FIG. 1 is a block diagram of one embodiment of a processor core.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of a processor core is shown. It is noted that processor core 5 shown here is an exemplary embodiment, and that other types of processor cores may be utilized in conjunction with the various TLB method and apparatus embodiments discussed below.

In the embodiment shown, processor core 5 includes a level two (L2) cache 10, a level one (L1) instruction cache 15, and an L1 data cache 13. The L1 caches in the embodiment shown are coupled between L2 cache 10 and execution pipeline(s) 12, which may include one or more execution units as well as other logic to support the execution of instructions (e.g., registers, branch prediction units, etc.). Processor core 5 also includes a memory management unit (MMU) 11 in the embodiment shown. MMU 11 is configured to support the movement of data and instructions between the various caches and the execution pipeline(s) 12, as well as to and from main memory. Processor core 5 also includes a load-store unit (LSU) 17 coupled to L2 cache 10, L1 data cache 13, An instruction translation lookaside buffer (TLB) 16 subsystem is coupled between L1 instruction cache 15 and MMU 11. A data TLB subsystem 14 is coupled between L1 data cache 13 and MMU 11. Each of the TLB subsystems includes a TLB configured to store virtual-to-physical memory address translations. The virtual addresses are used by software executing in processor core 5. When software requests data or instructions from memory, a virtual address is provided to the corresponding TLB. If a corresponding physical address is stored in the TLB, it is then provided to MMU 11 in order to access the requested information from memory (or from a cache, if stored therein).

Processor core 5 in the embodiment shown is configured for multi-threaded execution. That is, multiple instruction threads may execute concurrently on the execution pipelines. Each thread may access certain pages of memory. In many cases, a given thread may access pages from the memory in a non-uniform manner. This is known as the principle of locality. The principle of temporal locality states that a thread is likely to access again a page that has been recently accessed. The principle of spatial locality, a thread is likely to access another page that is stored in a location physically near a recently accessed page. The principle of locality thus determines which pages have corresponding address translations stored in the instruction TLB and the data TLB. Moreover, each of a number of threads concurrently executing on processor core 5 may be associated with one or more address translations stored in the instruction and data TLB's.

The TLB subsystems discussed herein are configured to take advantage of the fact that each execution thread is associated with certain pages of memory, and thus certain address translations stored in the TLB's. During a search of a conventional TLB, each entry of a content addressable memory (CAM) storing virtual addresses may be compared to a requested virtual address. This can consume a significant amount of dynamic power. The TLB subsystem disclosed herein are configured such that, responsive to a request for an address translation by a given thread, the search may be confined to only those address translations that are associated with the thread. This may reduce the number of CAM entries (i.e. storage locations in the CAM) searched, and thereby reduce the amount of dynamic power consumed during each search. Embodiments of such a TLB subsystem are discussed in further detail below.

Figure 2:
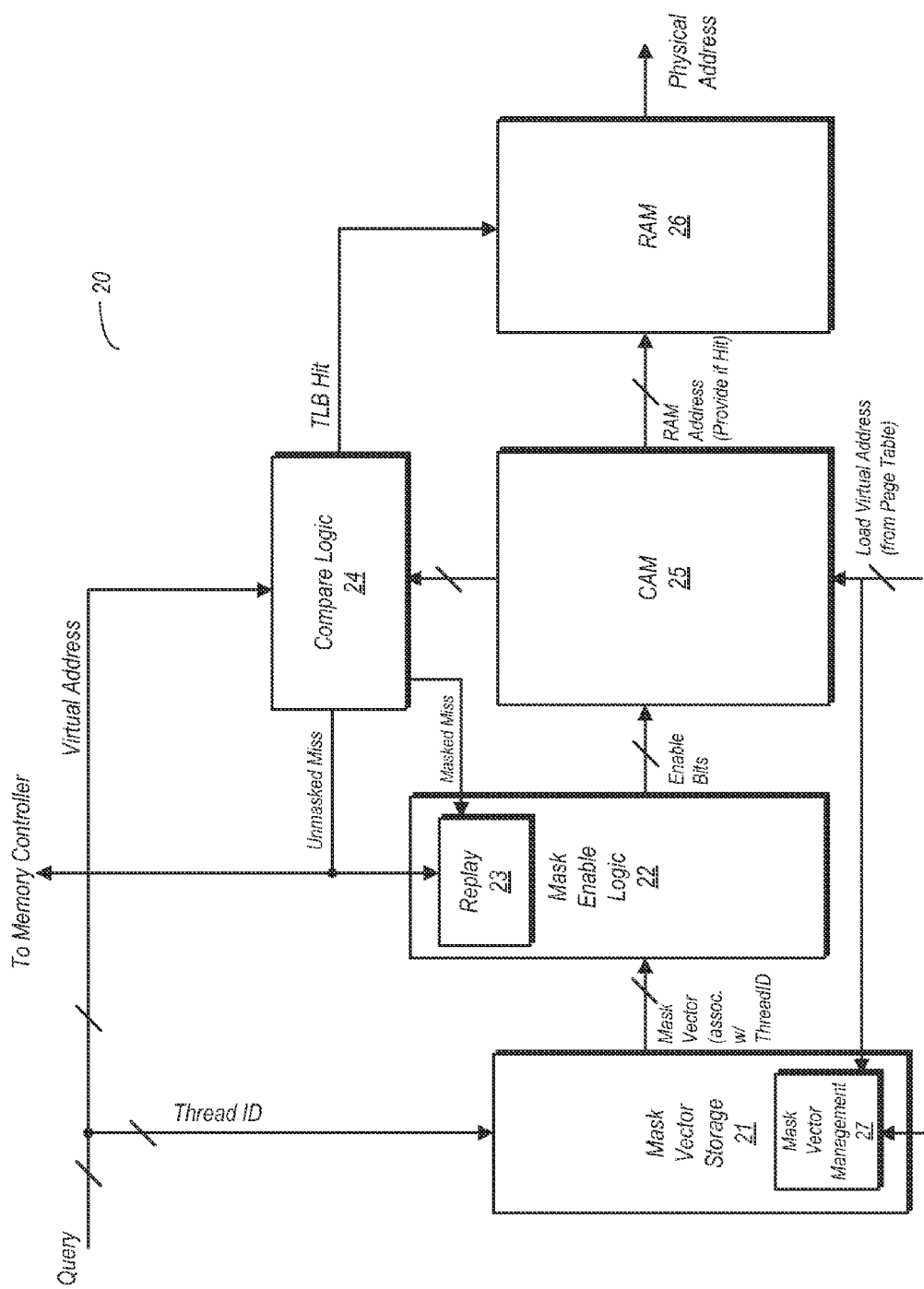
FIG. 2 is a block diagram of one embodiment of a TLB subsystem.

FIG. 2 is a block diagram of one embodiment of a TLB subsystem. TLB subsystem 20 in the embodiment shown may be used to implement either of the data or instruction TLB subsystems shown in FIG. 1. In the embodiment shown, TLB subsystem 20 includes a TLB that includes both CAM 25 and random access memory (RAM) 26. CAM 25 in the embodiment shown is configured to store virtual addresses, while RAM 26 is configured to store physical addresses that correspond to the virtual addresses. During a TLB query, the virtual address of the requested information (data or instructions) may be provided to compare logic 24, which is coupled to CAM 25. The virtual address is then compared to entries in the CAM 25 by compare logic 24. If a match is found between the provided virtual address and a virtual address stored in CAM 25 (a TLB hit), compare logic 24 indicates the TLB hit and a corresponding physical address is then provided from RAM 26.

TLB subsystem 20 in the embodiment shown includes a mask vector storage unit and mask enable logic unit 22. These units may work in conjunction to limit the number of CAM entries that are searched during a TLB query. In particular, these units may limit the entries searched in CAM 25 to those that are marked as being associated with thread making an initial query. Mask vector storage unit 21 in the embodiment shown is configured to store a number of mask vectors, one for each thread executing on processor core 5. Each mask vector may include a number of bits, one for each entry of CAM 25. A bit that is set (e.g., a logic 1) in a given mask vector may indicate that the thread corresponding to the mask vector is associated with a virtual address stored at the corresponding entry of CAM 25. That is, the thread is associated with a page of memory corresponding to a particular address translation stored in the TLB. If a bit in the mask vector is in a reset state (e.g., a logic 0), the thread corresponding to the mask vector is not associated with the CAM entry corresponding to the bit.

When a thread submits a query to TLB subsystem 20, its corresponding mask vector is provided from mask vector storage unit 21 to mask enable logic 22. Using the received mask vector, mask enable logic 22 is configured to enable those entries of CAM 25 storing virtual addresses that are designated as being associated with the thread submitting the query. The remaining entries of CAM 25 may be disabled and thus excluded from the search. Accordingly, compare logic 24 compares the received virtual address to the virtual addresses stored in the enabled entries of CAM 25. If the received virtual address is stored in one of the entries of CAM 25, a TLB hit is indicated and the corresponding physical address is provided form RAM 26. A hit resulting from a search of only those entries of CAM 25 that are enabled based on a mask vector may be referred to herein as a masked TLB hit. A TLB search in which only selected entries of CAM 25 are enabled based on a mask vector may be referred to as a masked search.

In some cases, a masked search may result in a TLB miss (referred to herein as a masked miss). A masked miss does not necessarily indicate that the requested address translation is not stored in the TLB, but rather that it was not found during the masked search. Compare logic 24 may provide an indication of a masked miss to a replay unit 23 in mask enable logic 22. Responsive to receiving the indication of a masked miss, mask enable logic 23 may enable all entries of CAM 25 for searching. Thereafter, the search for the virtual address received by compare logic 24 may be repeated (this search may be referred to as an unmasked TLB search). If the requested virtual address is found, a TLB hit is indicated and the corresponding physical address is provided from RAM 26. Furthermore, an indication of an unmasked TLB hit is provided to mask vector management logic 27 of mask vector storage unit 21. Responsive to receiving the indication of an unmasked TLB hit, mask vector management logic 27 may set, in the mask vector corresponding to the querying thread, the mask bit corresponding to the CAM entry in which the virtual address was found.

If, during an unmasked TLB search, the requested virtual address is not found, compare logic 24 may provide an indication of an unmasked TLB miss. This indicates that the desired address translation is not stored in the TLB. Responsive to the unmasked TLB miss, a search of a page table may be conducted to locate the virtual-to-physical address translation. Once the translation is located, it may be loaded into the TLB, and another entry (e.g., the least recently used) may be evicted therefrom. Furthermore, the mask bit corresponding to the CAM entry storing the virtual address portion of the translation may be set, by mask vector management logic 27, for the thread that initiated the TLB query that ultimately resulted in the unmasked TLB miss.

Over time, as threads execute on processor core 5, the most frequently accessed pages may change. A given thread may access a certain page repeatedly over time, but may eventually begin accessing another page more frequently. As such, the number of bits set in the mask vector corresponding to the thread may increase. An increasing number of mask bits set in a mask vector thus results in an increased number of CAM entries searched during a TLB query, and correspondingly, a greater consumption of dynamic power. Accordingly, at certain times, mask vectors stored in mask vector storage unit 21 may be reset by mask vector management logic 27. The resetting may occur periodically, after a certain number of bits in a mask vector are set, or after certain threshold values are met. In some embodiments, mask vectors may be managed individually and independently from one another. In other embodiments, mask vectors may be managed in groups of varying sizes up to an including management of all mask vectors in a single group. On embodiment of a mask vector management logic 27 and operation thereof is discussed below, although it is to be understood that this embodiment is not intended to limit the scope of this disclosure. Conversely, the disclosure is intended to cover all embodiments of circuitry (or software) used to manage mask vectors.

Figure 3:
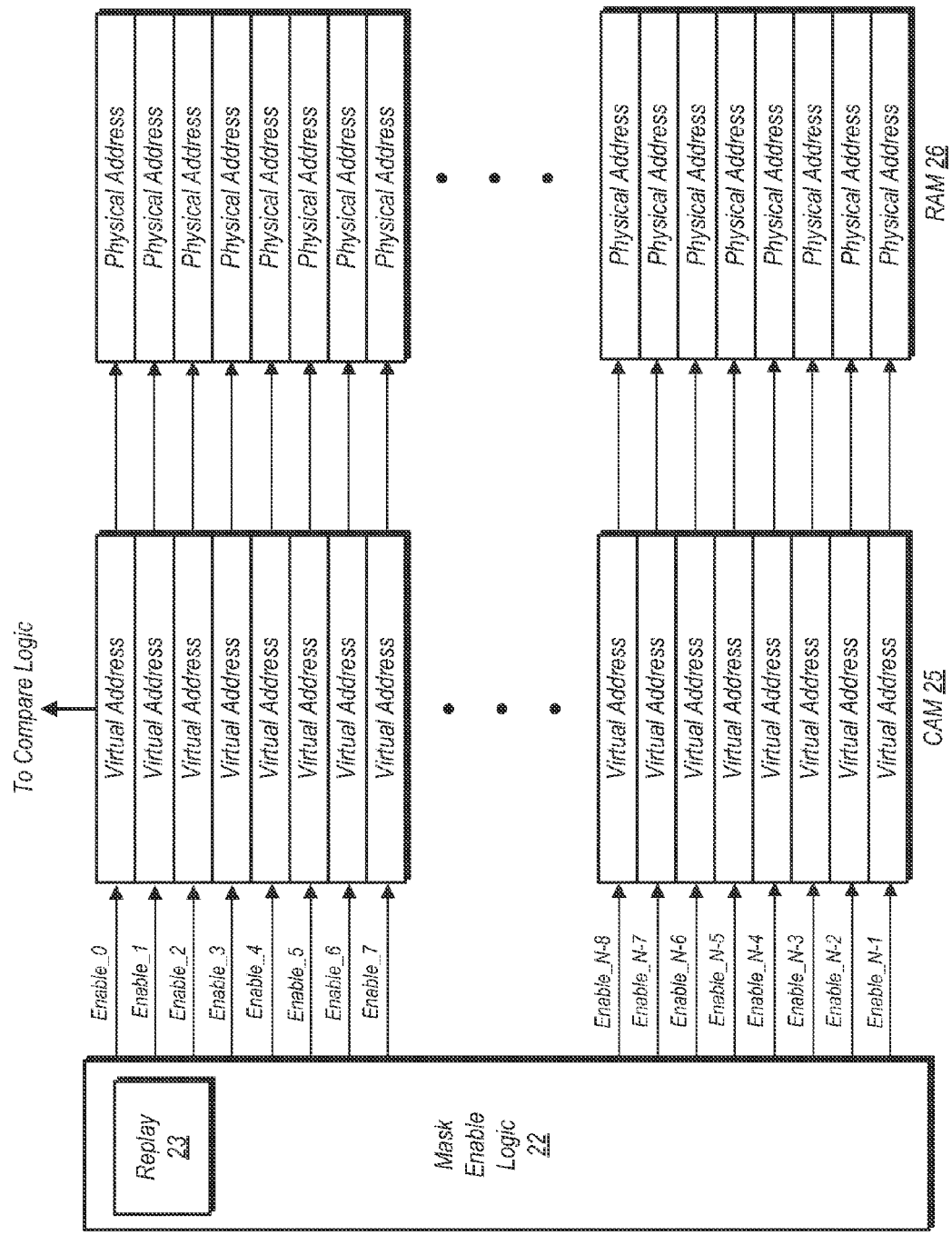
FIG. 3 is a block diagram illustrating of a content addressable memory (CAM) and a random access memory (RAM) of one embodiment of a TLB.

FIG. 3 illustrates the operation of one embodiment of mask enable logic 22. In the embodiment shown, mask enable logic 22 is coupled to provide corresponding enable signals to each of the N−1 entries of CAM 25. Each of the N−1 entries of CAM 25 has a direct correspondence with a unique one of the storage locations in RAM 25. Each of the entries of CAM 25 is configured to store a virtual address, each of which may be associated with one or more threads executing on processor core 5. During a masked search of CAM 25, various ones of the enable signals may be asserted in accordance with the received mask vector. For example, if a mask vector indicates that entries 0, 4, 7 and N−8 are associated with the thread making the TLB query, the enable signals corresponding to those entries are asserted, while the remainder of the enable signals remain de-asserted. Accordingly, only entries 0, 4, 7, and N−8 are searched for the desired virtual address in this example of a masked search. This may result in significant power savings if the desired virtual address is present in one of these entries, as opposed to searching the entirety of CAM 25. If the desired virtual address is found, a physical address is provided from a location in RAM 25 that corresponds to the CAM entry in which the virtual address was found.

As noted above, a masked TLB miss may result in a repeat of the TLB search. Responsive to a masked TLB miss, replay logic 23 within mask enable logic 22 may receive an indication of the masked TLB miss. Responsive to receiving the masked miss, replay logic 23 may cause mask enable logic 22 to assert all enable signals. Thereafter, the search for the requested virtual address may be repeated with all CAM entries enabled. Alternatively, mask enable logic 22 may assert the enables for only those entries that were not searched during the masked TLB search. This may realize some power savings over searching the entirety of CAM 25.

Figure 4:
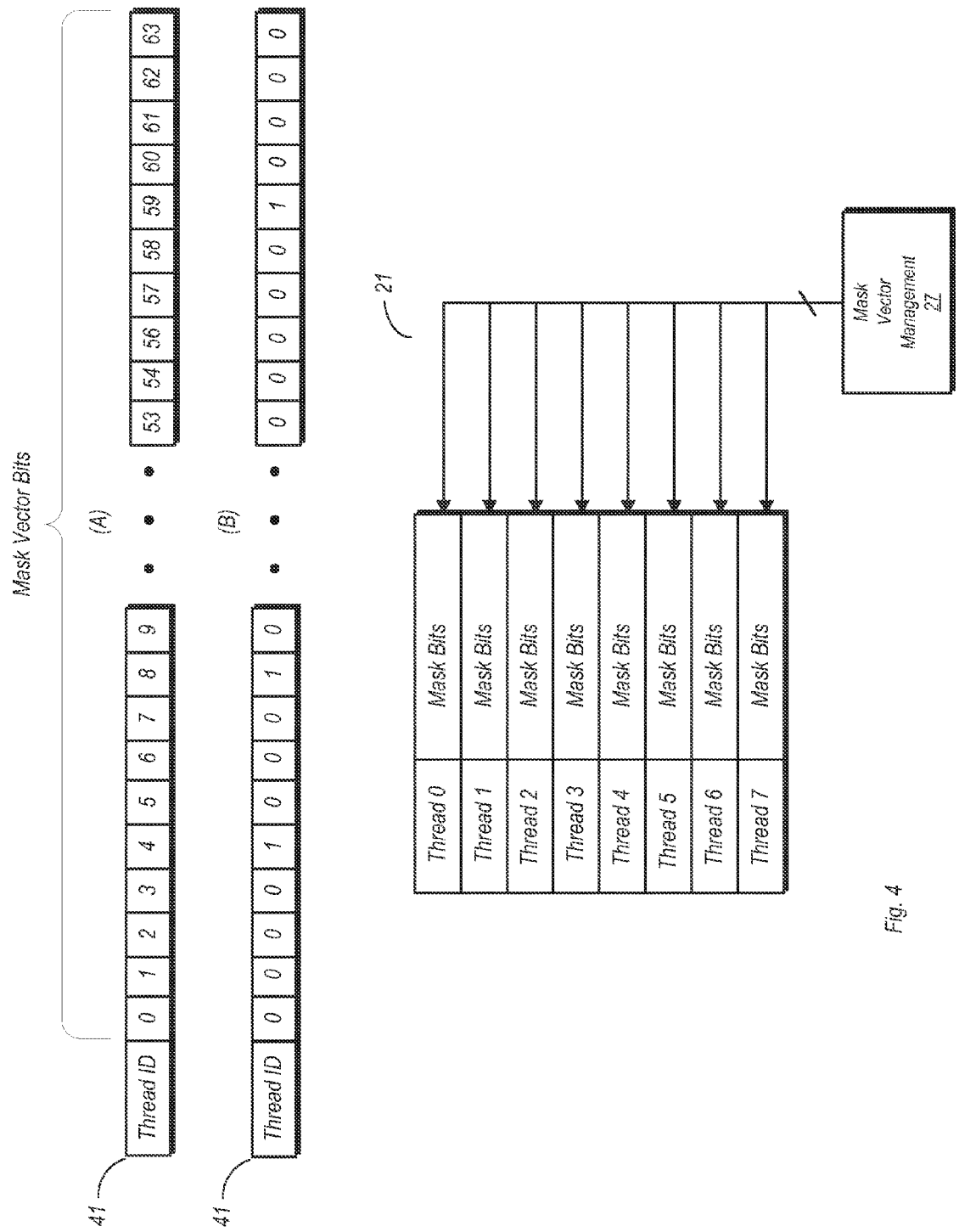
FIG. 4 is a diagram illustrating one embodiment of a mask vector and one embodiment of a mask storage unit.

FIG. 4 is a diagram illustrating one embodiment of a mask vector and one embodiment of a mask storage unit. In the illustrated example, mask vector 41 includes a thread identifier (Thread ID) to indicate the thread with which it is associated. Additionally, mask vector 41 includes a number of bits each associated with a unique one of the storage locations in CAM 25. In this particular example, CAM 25 is assumed to have 64 entries, or storage locations. Accordingly, in (A), mask vector 41 is shown as having 64 separate bit locations. When the thread indicated by the thread ID is associated with a virtual address stored in a particular location of CAM 25, its corresponding bit is set (e.g., logic 1). Otherwise, if not associated with a virtual address stored at a given location of CAM 25, the corresponding bit is reset (e.g., logic 0). In the exemplary mask vector shown in (B), storage locations 4, 8, and 59 of the CAM are associated with the thread indicated by the thread ID.

Figure 5:
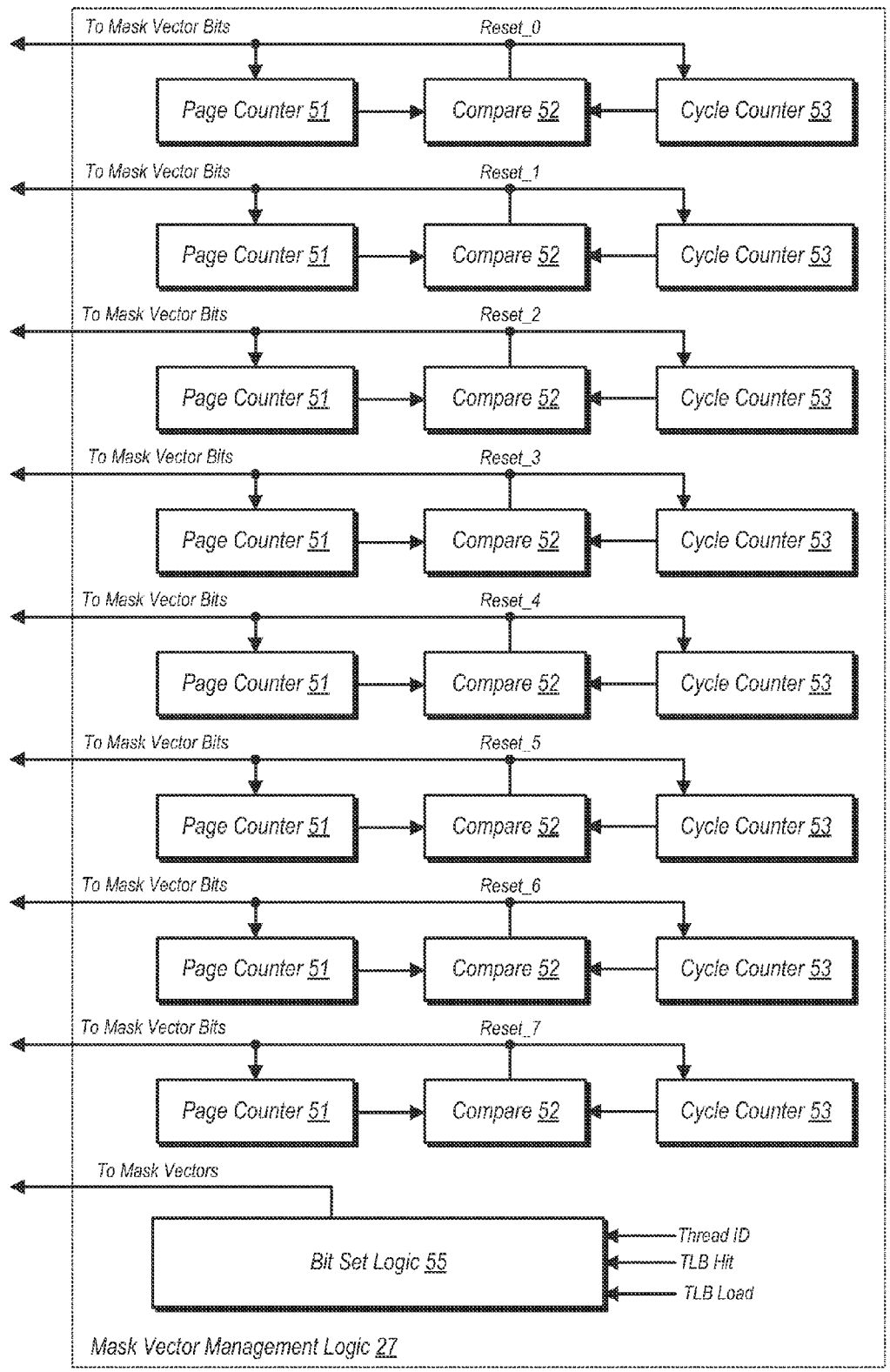
FIG. 5 is a diagram illustrating one embodiment of mask vector management logic.

Mask vector storage unit 21 is configured to store each of the mask vectors including their respective thread ID's. Mask vector management logic 27 is coupled to each of the locations storing a mask vector, and is configured to manage the setting and resetting of mask vector bits. FIG. 5 illustrates one embodiment of mask vector management logic 27. In the embodiment shown, mask vector management logic includes bit set logic 55, which is configured to set individual mask bits in the various mask vectors.

Bit set logic 55 in the embodiment shown is configured to receive signals indicating a TLB hit and TLB load. Both the TLB hit and TLB load signals may be received concurrently with a thread ID indicating the thread that caused the TLB hit or TLB load. Furthermore, both the TLB hit and TLB load signals may be multi-bit signals that include an indication of the storage location CAM 25 where the virtual address was found (in the case of a TLB hit) or stored into (in the case of a TLB load). When a TLB hit occurs, the TLB hit signal may be provided to bit set logic 55, along with the thread ID. If the bit corresponding to the location of the virtual address has not been set in the mask vector corresponding to the thread ID, bit set logic 55 may set the bit. Otherwise, if the bit is already set, no action is taken by bit set logic 55. If a TLB load occurs (responsive to an unmasked TLB miss), bit set logic 55 may set the bit corresponding to the storage location in CAM 25 where the virtual address was stored in the mask vector corresponding to the associated thread ID.

Mask vector management logic 27 in the embodiment shown also includes a number of page counters 51, a corresponding number of comparators 52, and a corresponding number of cycle counters 53. More particularly, one page counter 51, one comparator 52, and one cycle counter 53 is provided for each mask vector (and thus, for each thread that may execute on processor core 5 at a given time). In this example, eight threads may be concurrently executing on processor core 5.

Each page counter 51 may be used to count the number of bits set in the mask vector corresponding thereto (and thus the number of pages associated with a given thread having address translations stored in the TLB). The count value provided by each page counter 51 may be provided to its correspondingly coupled comparator 52, where it may be compared to a threshold value. The threshold value may be used as a basis for determining if the corresponding mask vector is to be reset.

Each cycle counter 53 is also configured to provide a count value to its correspondingly coupled comparator 52. Each cycle counter 53 may count a number of cycles that have elapsed since the previous reset of its corresponding mask vector. In some embodiments a cycle may be a clock cycle. In other embodiments, a cycle may be an instruction execution cycle, and thus the count may indicate how many instructions have been executed since the previous reset. An instruction cycle count may be thread specific (i.e., tracking only executed instructions for that particular thread) or general (i.e. tracking executed instructions for all threads). In general, a cycle may be defined in various ways for different embodiments. The cycle count provided by a cycle counter 53 may also be compared to a threshold value by a corresponding comparator 52.

Each comparator 52 may compare the count values received to predefined threshold values, and may cause a reset of a mask vector if certain conditions are met. For example, in one embodiment, a comparator 52 may cause a reset of a mask vector (i.e. setting all bits to zero) if a count value provided by a page counter 51 exceeds a page count threshold. In many cases, the number of pages associated with a given thread may increase over time, resulting in more CAM entries being searched during a TLB query. Resetting and subsequently repopulating the mask vector may limit the number of CAM entries searched over time, thereby reducing power consumption.

In another embodiment, mask vectors may be periodically reset according to the count value provided by a corresponding cycle counter 53. As the cycle count value increases, it may eventually pass a predefined value, thereby triggering a reset of the corresponding mask vector.

In yet another embodiment, both the page count value and cycle count values may be considered in determining if a reset is to be performed. For example, the cycle count provided by a cycle counter 53 may be allowed to increment until it passes a predetermined threshold. Thereafter, the page count provided by the corresponding page counter 51 may be compared to another predetermined threshold. If the page count is less than the predetermined threshold, no reset is performed and the cycle counter continues incrementing. If the page count eventually increases to where it meets or exceeds the page count threshold after the cycle count threshold has been passed, the corresponding counter may assert a reset signal, thereby resetting the bits of the corresponding mask vector.

Broadly speaking, a number of different embodiments are possible for periodic or aperiodic resetting of mask vectors. In some embodiments, resetting may be performed on individual mask vectors independent of the state of others. In other embodiments, mask vectors may be reset in groups of two or more, and up to and including the all entries in the CAM. The various metrics used to determine when mask vectors are reset may include those discussed above (page counts and cycle counts), or other metrics not explicitly discussed herein.

Figure 6:
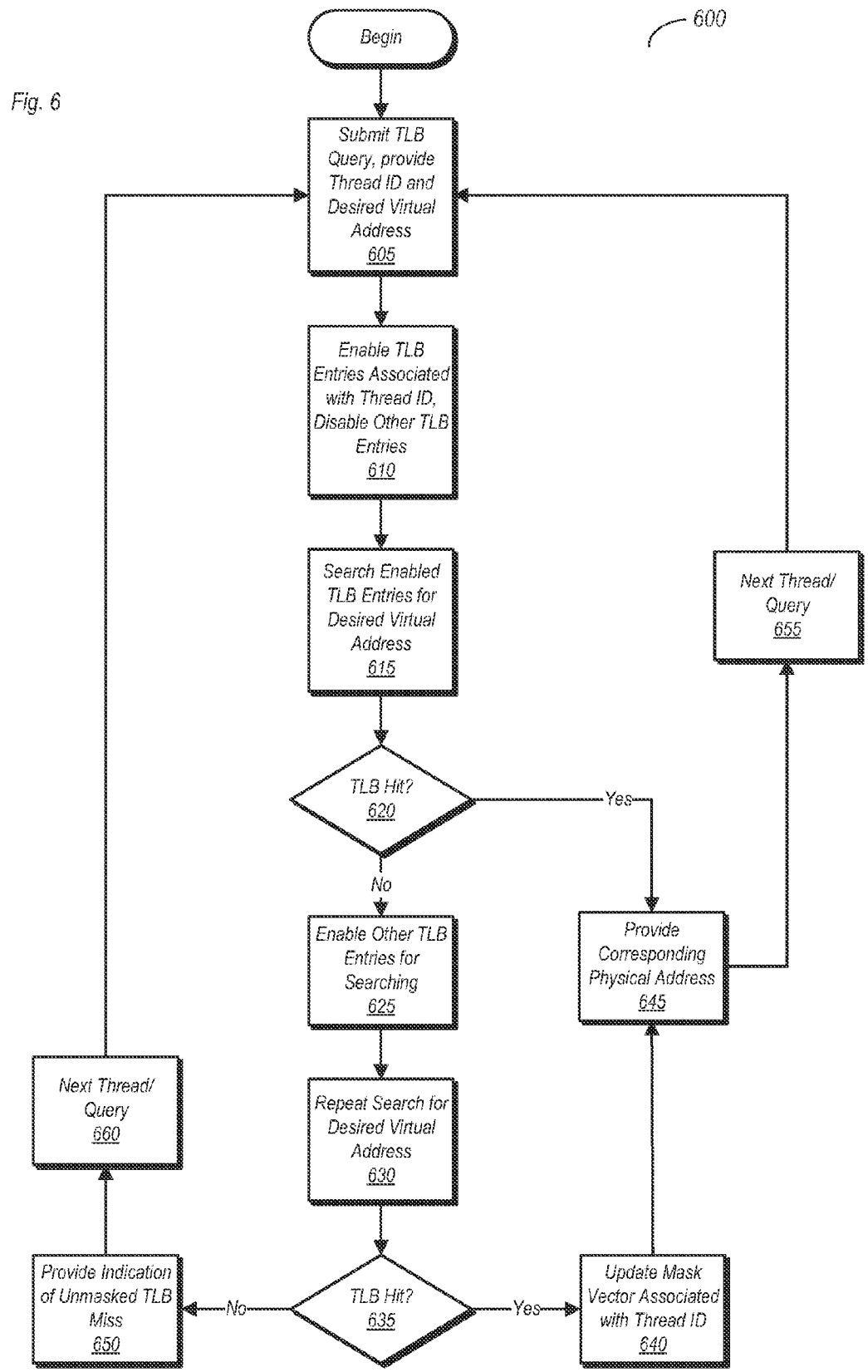
FIG. 6 is a flow diagram illustrating a method of searching one embodiment of TLB implemented in one embodiment of a TLB subsystem.

FIG. 6 is a flow diagram illustrating a method of searching one embodiment of TLB implemented in one embodiment of a TLB subsystem. Method 600 may be performed using various embodiments of the hardware discussed above. Furthermore, embodiments of hardware not explicitly discussed herein may also be capable of performing the methodology illustrated in FIG. 6, and thus fall within the scope of this disclosure.

Method 600 begins with the submission of a TLB query (block 605). The TLB query may include both a thread ID to indicate the thread initiating the query, as well as the virtual address for the desired translation. The thread ID may be provided to logic that determines (e.g., based on a mask vector as discussed above) which entries in the CAM of a TLB are designated as being associated with the submitting thread. CAM entries indicated as being associated with the thread submitting the query may be enabled for searching, while other CAM entries are disabled such that they are not searched (block 610). Thereafter, the enabled CAM entries are searched for the virtual address of the desired translation (block 615). Limiting the number of entries searched may result in power savings relative to previous methods in which all entries of an equivalent CAM are searched with every TLB query.

If the search of the enabled entries of the TLB results in a TLB hit, i.e. finding the virtual address of the desired translation (block 620, yes), then the corresponding physical address may be provided from the RAM of the TLB (block 645). If the virtual address of the desired translation is not found among the enabled entries that are searched (block 620, no), then the other, previously disabled entries of the CAM may be enabled for searching (block 625). In some embodiments, this may entail enabling all CAM entries while in other embodiments the entries searched previously may be disabled, with the search limited to those entries excluded from the initial search. Thereafter, the search for the virtual address of the desired translation may be repeated (block 630).

If a TLB hit occurs on the search of the other (or all) CAM entries (block 635, yes), a mask vector associated with the thread ID may be updated to indicate an association between the thread and the CAM entry where the virtual address was found (block 640). The corresponding physical address may also be provided from the RAM (block 645). Thereafter, the method may progress to the next thread/query (block 655), and repeat. If the next query is initiated by a different thread, the sets of TLB entries that are enabled and inhibited may be different from those sets enabled/inhibited during the previous query. In general, the enabled/inhibited TLB entries over time may dynamically change based on the associations between the threads that submit the queries and their respective associations with various ones of the TLB entries.

If a TLB miss occurs on the search of the other (or all) CAM entries (block 635, no), then an indication of an unmasked TLB miss is generated (block 650). The indication may be provided to a memory controller or other unit, which may initiate a search of a page table for the desired address translation. If the page associated with the translation is not in memory, the page may be loaded from bulk storage. After generating the indication of an unmasked TLB miss, method 600 may progress to the next thread/query (block 660).

Figure 7:
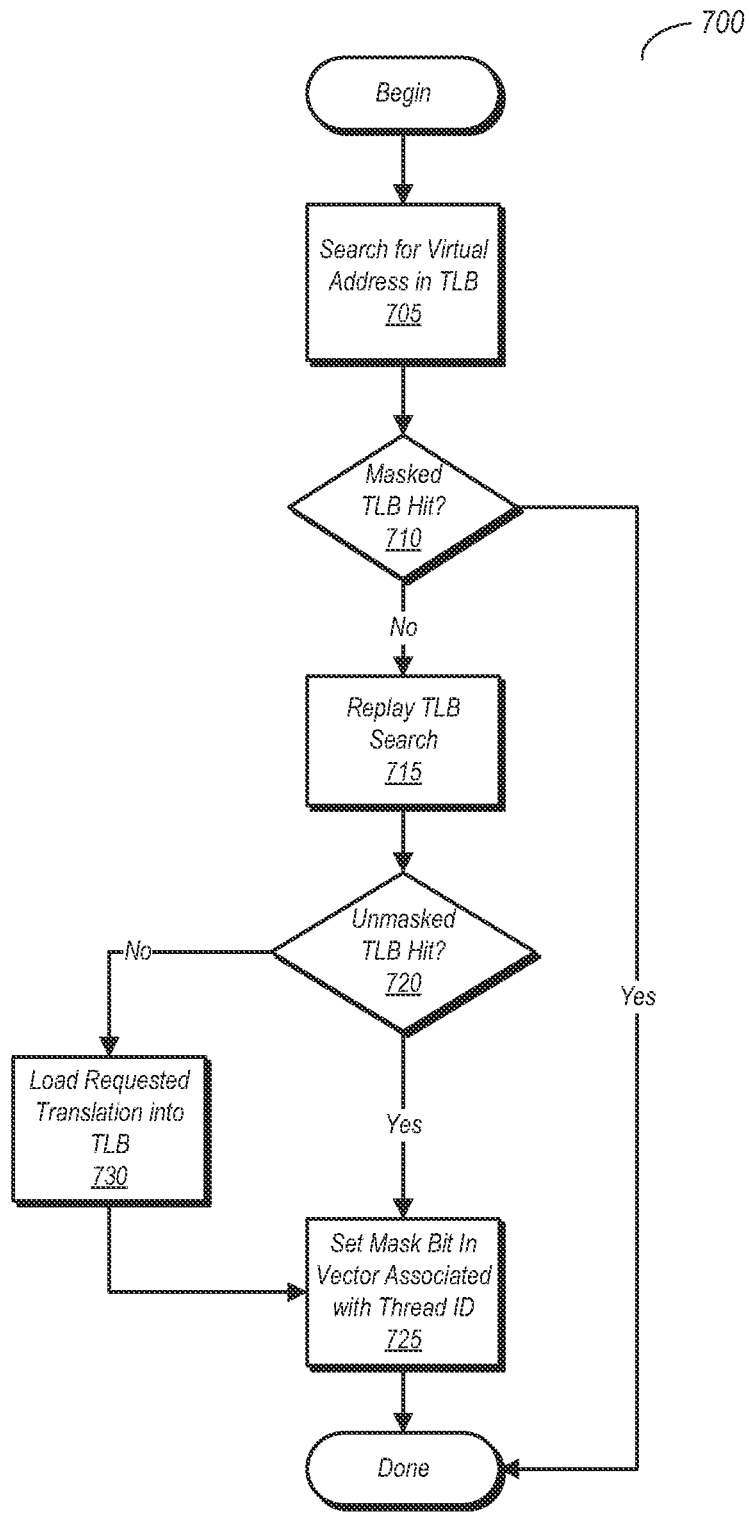
FIG. 7 is a flow diagram of one embodiment of a method for populating mask vectors used to determine which entries of a TLB are to be searched on a given TLB query.

FIG. 7 is a flow diagram of one embodiment of a method for populating mask vectors used to determine which entries of a TLB are to be searched on a given TLB query. As with method 600, method 700 may be performed with various embodiments of the hardware discussed above, as well as with embodiments not explicitly discussed herein, but are otherwise considered to fall within the scope of this disclosure.

Method 700 begins with a masked search of the TLB for a virtual address associated with a desired translation (block 705). If the virtual address of the desired is found (block 710, yes), the method is complete and no mask vectors are updated. If the masked TLB search does not result in a hit (block 710, no), then the TLB search is replayed, with the previously unsearched entries included in the search (block 715). If the replayed search results in a TLB hit (block 720, yes), then the mask bit in the mask vector associated with the thread ID is set, indicating an association between the virtual address stored in the CAM entry where it was found and the thread that initiated the query (block 725). If the replay search results in a TLB miss (block 720, no), then a chain of events may be initiated which results in the loading of the desired translation into the TLB (block 730). Thereafter, a mask vector bit is set to associate the virtual address in the entry in which it was stored with the thread that initiated the TLB query.

It is noted that at the beginning of operation, or immediately after a reset, all mask bits for a given mask vector may be in a reset state. In such instances, no mask search is performed. Instead, the initial search or first post-reset search for a given thread may include all CAM entries, with subsequent searches for that thread being masked searches when one or more mask bits have been set for a given mask vector.

Figure 8:
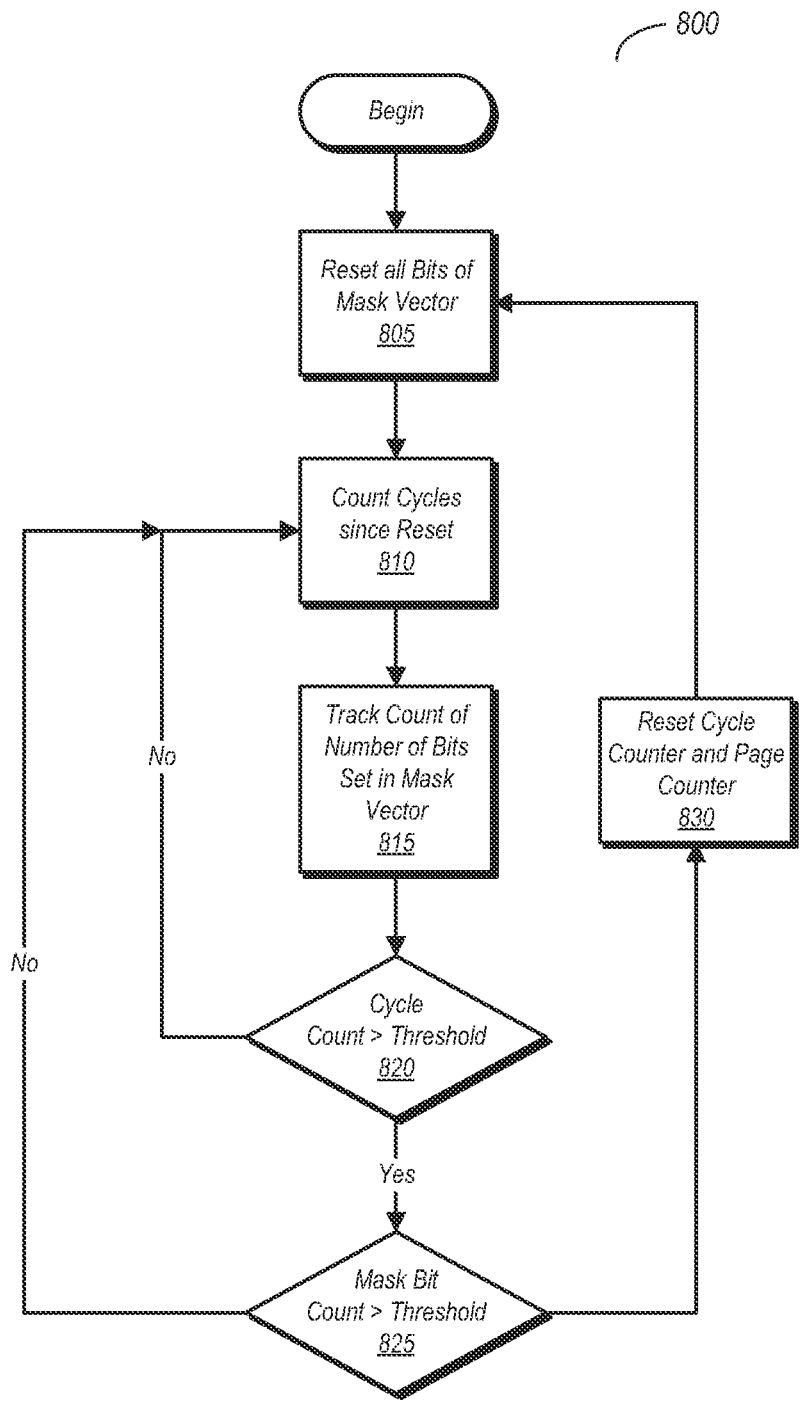
FIG. 8 is a flow diagram is a flow diagram illustrating one embodiment of a method for controlling the resetting of mask vectors in one embodiment of a TLB subsystem.

FIG. 8 is a flow diagram is a flow diagram illustrating one embodiment of a method for controlling the resetting of mask vectors in one embodiment of a TLB subsystem. Method 800 may be performed with the hardware embodiments discussed above and others not explicitly discussed herein. Furthermore, method 800 is an exemplary embodiment of a method for resetting mask vectors, but is not intended to limit the hardware discussed above from performing other method embodiments based on different metrics and method steps.

Method 800 begins with the reset of all bits of a mask vector (block 805). This may include a reset that occurs at the beginning of system operation. After the reset, a cycle counter may begin incrementing to count the cycles that have elapsed since the reset (block 810). The cycles may be clock cycles, instructions executed for a thread associated with the mask vector, total instructions executed, or any other suitable definition of a cycle. As the cycle counter increments, a number of bits set in the mask vector may also be tracked (block 815). This may be performed by a counter, which increments each time another mask bit is set in the mask vector. If the cycle count is less than a predetermined cycle count threshold (block 820, no), the method continues from block 810. If the cycle count is greater than the than the threshold (block 820, yes), a comparison is made between the mask bit count and a predetermined threshold. If the mask bit count is less than the threshold (block 825, no), the method returns to block 810. If the mask bit count is greater than the predetermined threshold (block 825, yes), then the cycle bit counter and page counters are reset (block 830). Thereafter, the method progresses to block 805, where all bits of the mask vector are reset, with the method repeating from that point.

Numerous variations and modifications will become apparent to those skilled in the art once the above disclosure is fully appreciated. It is intended that the following claims be interpreted to embrace all such variations and modifications.

What is claimed is:

1. A translation lookaside buffer (TLB) comprising:
    a content addressable memory (CAM) having a plurality of entries each storing a virtual address corresponding to one of a plurality of address translations;
    enable logic configured to, responsive to a TLB query, enable searching of selected ones of the CAM entries that correspond to a thread that initiated the TLB query, wherein the thread that initiated the TLB query is one of a plurality of threads executing on a processor, and wherein the enable logic is further configured to inhibit searching of CAM entries that are not associated with the thread that initiated the TLB query;
    a mask vector storage unit configured to store a plurality of mask vectors, wherein each of the plurality of mask vectors uniquely corresponds to one of the plurality of threads executing on the processor, wherein each mask vector includes a plurality of bits each uniquely corresponding to one of the plurality of CAM entries, wherein each bit, when set, indicates that the thread corresponding to that mask vector is associated with the CAM entry corresponding to that bit.

2. The TLB as recited in claim 1, further comprising mask vector management logic, wherein the mask vector management logic is configured to set a bit in a given one of the mask vectors responsive to determining that a corresponding CAM entry is associated with a one of the plurality of threads corresponding to the given one of the mask vectors.

3. The TLB as recited in claim 2, wherein the mask vector management logic includes at least one counter configured to indicate a number of cycles that have elapsed since a most recent reset of at least one mask vector.

4. The TLB as recited in claim 3, wherein the at least one counter is configured to indicate a number of cycles that have elapsed since a reset of all mask vectors, and wherein the mask vector management logic includes comparison logic configured to compare a number of mask bits set in each mask vector to a thread count threshold value.

5. The TLB as recited in claim 4, wherein the mask vector management logic is configured to reset each bit in each mask vector if a count value indicated by the at least one counter has exceeded a cycle count threshold value and a number of mask bits set in at least one mask vector exceeds the thread count threshold value.

6. The TLB as recited in claim 3, wherein the mask vector management logic includes a plurality of counters each uniquely corresponding to one of the plurality of threads and a plurality of comparators each uniquely corresponding to one of the plurality of threads, wherein the mask vector management logic is configured to clear a mask vector corresponding to a particular one of that plurality of threads responsive to determining that a count value of the corresponding counter exceeds a cycle count threshold and a comparison result performed by the corresponding comparator indicates that a number of bits set in the mask vector exceeds a thread count threshold.

7. The TLB as recited in claim 1, further comprising replay logic, wherein responsive to a miss during a search of only the selected entries of the CAM, the replay logic is configured to cause the search to be repeated with all CAM entries enabled.

8. The TLB as recited in claim 7, wherein the replay logic is further configured to:
    indicate occurrence of a hit responsive to a search of all CAM entries finding a requested virtual address; and
    provide an indication to a memory controller of a TLB miss responsive to a search of all CAM entries failing to find the requested virtual address.

9. A method comprising:
    providing a query to a translation lookaside buffer (TLB), wherein the query is associated with a particular one of a plurality of threads executing on a processor;
    searching content addressable memory (CAM) entries in a CAM of the TLB based on which of the CAM entries are associated with the particular one of the plurality of threads, wherein each CAM entry is configured to store a virtual address of an address translation;
    storing a plurality of mask vectors each corresponding to one of the plurality of threads, each of the plurality of mask vectors including a plurality of bits wherein each bit uniquely corresponds to one of a plurality of CAM entries in the CAM, wherein each of the plurality of bits of a given one of the plurality of mask vectors indicates, when set, that a CAM entry corresponding to that bit is associated with a one of the plurality of threads that is uniquely associated with the given one of the plurality of mask vectors and inhibiting searching of CAM entries that are not associated with the particular one of the plurality of threads.

10. The method as recited in claim 9, further comprising repeating said searching with all CAM entries enable responsive to a miss occurring during searching of only those CAM entries associated with the particular one of the plurality of threads.

11. The method as recited in claim 10, further comprising updating a mask vector responsive to a hit during the search of all CAM entries, wherein the mask vector includes a plurality of bits indicating which CAM entries are associated with the particular one of the plurality of threads.

12. The method as recited in claim 11, further comprising resetting the mask vector if a predetermined number of cycles have elapsed since a previous reset of the mask vector and if a number of CAM entries associated with a thread corresponding to the mask vector exceeds a thread count threshold.

13. The method as recited in claim 10, further comprising providing an indication of a TLB miss responsive to a failure to find an address translation during a search of all CAM entries.

14. A translation lookaside buffer (TLB) subsystem comprising:
   a content addressable memory (CAM) having a first plurality of storage locations, wherein each of the first plurality of storage locations is configured to store a virtual address that corresponds to a physical address stored in one of a second plurality of storage locations in a random access memory (RAM);
   a mask vector storage unit having a third plurality of storage locations each configured to store a mask vector corresponding to one of plurality of threads executing on a processor core that includes the TLB subsystem, wherein each mask vector includes a plurality of bits each uniquely corresponding to one of the first plurality of storage locations, and wherein each of the plurality of bits indicates, when set, that the corresponding one of the plurality of threads is associated with a virtual address stored at the CAM entry corresponding to the one of the plurality of bits;
   enable logic configured to access, from the mask vector storage unit a mask vector, corresponding to a one of the plurality of threads requesting a search of the CAM for a specified virtual address, wherein the enable logic is configured to inhibit searching of CAM entries that are not associated with the one of the plurality of threads as indicated by the plurality of bits of the mask vector corresponding to the one of the plurality of threads; and
   mask vector management logic configured to track an amount of time elapsed from a most recent reset of bits for each mask vector and further configured to track a number of bits set in each mask vector, wherein the mask vector management logic is configured to reset each bit of a given mask vector if an amount of time elapsed since a previous reset exceeds a time threshold and a number of bits set in the given mask vector exceeds a count threshold.

15. The TLB subsystem as recited in claim 14, wherein the enable logic configured to enable searching of all of the first plurality of storage locations responsive to a TLB query for a specified virtual address resulting in a TLB miss after searching only a subset of first plurality of entries that are indicated as being associated with a one of the plurality of threads that initiated the TLB query.

* * * * *

UNITED STATES PATENT AND TRADEMARK OFFICE
CERTIFICATE OF CORRECTION

| | | |
|---|---|---|
| PATENT NO. | : 9,208,261 B2 | Page 1 of 1 |
| APPLICATION NO. | : 14/163096 | |
| DATED | : December 8, 2015 | |
| INVENTOR(S) | : Shah et al. | |

It is certified that error appears in the above-identified patent and that said Letters Patent is hereby corrected as shown below:

In the specification

In column 1, line 56, before "with" delete "to".

In column 3, line 17, delete "cache 13," and insert -- cache 13. --, therefor.

Signed and Sealed this
Twenty-third Day of August, 2016

Michelle K. Lee
*Director of the United States Patent and Trademark Office*